(12) United States Patent
Shin et al.

(10) Patent No.: US 10,878,758 B2
(45) Date of Patent: Dec. 29, 2020

(54) DISPLAY DEVICE INCLUDING SCAN DRIVER FOR DRIVING DISPLAY PANEL IN WHICH EMPTY AREA ENCLOSED BY DISPLAY AREA IS FORMED

(71) Applicant: Samsung Electronics Co., Ltd., Suwon-si (KR)

(72) Inventors: Hyunchang Shin, Suwon-si (KR); Yongkoo Her, Suwon-si (KR); Joongyu Lee, Suwon-si (KR); Songhee Jung, Suwon-si (KR); Jaeseung Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/423,849

(22) Filed: May 28, 2019

(65) Prior Publication Data

US 2019/0362678 A1 Nov. 28, 2019

(30) Foreign Application Priority Data

May 25, 2018 (KR) .................... 10-2018-0059784

(51) Int. Cl.
*G09G 3/3266* (2016.01)
*H01L 27/12* (2006.01)
*H01L 27/32* (2006.01)

(52) U.S. Cl.
CPC ......... *G09G 3/3266* (2013.01); *H01L 27/124* (2013.01); *G09G 2310/0202* (2013.01); *H01L 27/3276* (2013.01)

(58) Field of Classification Search
CPC .......... G09G 3/3266; G09G 2310/0202; H01L 27/124; H01L 27/3276
See application file for complete search history.

(56) References Cited

U.S. PATENT DOCUMENTS 10,186,191 B2 * 1/2019 Kang .................. H01L 27/3276
2009/0051636 A1 * 2/2009 Natori .................. G09G 3/3648
345/87

(Continued)

FOREIGN PATENT DOCUMENTS

| KR | 10-2014-0086708 A | 9/2014 |
| KR | 10-2017-0064598 A | 6/2017 |
| KR | 10-2017-0065059 A | 6/2017 |

OTHER PUBLICATIONS

International Search Report dated Aug. 29, 2019, issued in International Patent Application No. PCT/KR2019/006314.

*Primary Examiner* — Vinh T Lam
(74) *Attorney, Agent, or Firm* — Jefferson IP Law, LLP

(57) ABSTRACT

A display device is provided. The display device includes a display driver circuit, and a display panel including a display area including a plurality of pixels, a non-display area, an empty area enclosed by the plurality of pixels, a first scan driving circuit disposed in a first partial area of the non-display area formed outside of a first side of the display area, at least one first scan line extended towards the empty area from the first scan driving circuit, a second scan driving circuit and disposed in a second partial area of the non-display area formed outside a second side adjacent to the first side of the display area, and at least one second scan line extended towards the empty area from the second scan driving circuit to be connected to at least one second pixel of the plurality of pixels.

20 Claims, 11 Drawing Sheets

(56) References Cited

U.S. PATENT DOCUMENTS

| | | | |
|---|---|---|---|
| 2010/0060842 A1* | 3/2010 | Igeta | G02F 1/13394 349/153 |
| 2015/0318328 A1* | 11/2015 | Bibl | H01L 51/50 257/89 |
| 2017/0031389 A1* | 2/2017 | Yoo | G06F 1/1652 |
| 2017/0134543 A1 | 5/2017 | Kim et al. | |
| 2017/0154566 A1* | 6/2017 | Ryoo | G09G 3/3648 |
| 2017/0162111 A1 | 6/2017 | Kang et al. | |
| 2019/0214595 A1* | 7/2019 | Park | G06F 3/0443 |
| 2019/0296152 A1* | 9/2019 | Gu | H01L 27/1214 |
| 2019/0347988 A1* | 11/2019 | Zhang | G09G 3/3233 |
| 2019/0363266 A1* | 11/2019 | Tanaka | H01L 51/56 |

* cited by examiner

DISPLAY DEVICE INCLUDING SCAN DRIVER FOR DRIVING DISPLAY PANEL IN WHICH EMPTY AREA ENCLOSED BY DISPLAY AREA IS FORMED

CROSS-REFERENCE TO RELATED APPLICATION(S)

This application is based on and claims priority under 35 U.S.C. § 119(a) of a Korean patent application number 10-2018-0059784, filed on May 25, 2018, in the Korean Intellectual Property Office, the disclosure of which is incorporated by reference herein in its entirety.

BACKGROUND

1. Field

The disclosure relates to a display device including a scan driving circuit for driving a display panel in which an empty area enclosed by a display area is formed.

2. Description of the Related Art

Nowadays, with the development of digital technology, various types of electronic devices (e.g., display device) such as a mobile communication terminal, smart phone, tablet personal computer (PC), notebook computer, personal digital assistant (PDA), wearable device, or digital camera are widely used.

For example, in an electronic device having spatial restrictions, a display device (e.g., a full screen display that extends a display area of a screen to a bezel area formed outside the electronic device or an area adjacent to the bezel area) for obtaining a maximum screen is required.

In a display device, as a display area that displays a screen is extended gradually, unlike the prior art in which a specific area (e.g., hole area or empty area) required for implementing a function of a camera or a sensor mounted in the display device is disposed at the upper end of a non-display area, which is a bezel area, the specific area (e.g., hole area or empty area) may be formed in a shape enclosed by pixels within the display area.

For example, a pixel or a wiring should not be disposed in the empty area, for function implementation of a camera or a sensor. Therefore, in an area adjacent to the empty area, pixels for outputting image data may not be disposed or a dead space (DS) (e.g., black area) is excessively formed according to a dense disposition structure of wirings for applying a driving signal to pixels disposed in an area adjacent to the empty area and thus the aesthetic sense may be deteriorated.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below. Accordingly, an aspect of the disclosure is to provide a display device for maximizing a display occupied area thereof.

Additional aspects will be set forth in part in the description which follows and, in part, will be apparent from the description, or may be learned by practice of the presented embodiments.

In accordance with an aspect of the disclosure, a display device is provided. The display device includes a display driver circuit, and a display panel including a display area including a plurality of pixels, a non-display area formed outside the display area, an empty area in which the plurality of pixels is not disposed in at least part of the display area and enclosed by the plurality of pixels, a first scan driving circuit electrically connected to the display driver circuit and disposed in a first partial area of the non-display area formed outside of a first side of the display area, at least one first scan line extended towards the empty area from the first scan driving circuit to be connected to at least one first pixel of the plurality of pixels, a second scan driving circuit electrically connected to the first scan driving circuit and disposed in a second partial area of the non-display area formed outside a second side adjacent to the first side of the display area, and at least one second scan line extended towards the empty area from the second scan driving circuit to be connected to at least one second pixel of the plurality of pixels.

In accordance with another aspect of the disclosure, a display device is provided. The display device includes a display driver circuit, and a display panel including a display area including a plurality of pixels, a non-display area formed outside the display area, an empty area in which the plurality of pixels is not disposed in at least part of the display area and enclosed by the plurality of pixels, a scan driving circuit electrically connected to the display driver circuit and disposed in the non-display area, at least one scan line extended from the scan driving circuit to be connected to the plurality of pixels, at least one first data line electrically connected to the display driver circuit and extended towards the empty area from the display driver circuit to be connected to at least one first pixel disposed at a first side among the plurality of pixels, and at least one second data line electrically connected to the display driver circuit and extended from the display driver circuit to be connected to at least one second pixel disposed at a second side adjacent to the empty area among the plurality of pixels through the non-display area.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding, but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but are merely used by the inventor to enable a clear and consistent understanding of the disclosure. Accordingly, it should be apparent to those skilled in the art that the following description of various embodiments of the disclosure is provided for illustration purposes only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
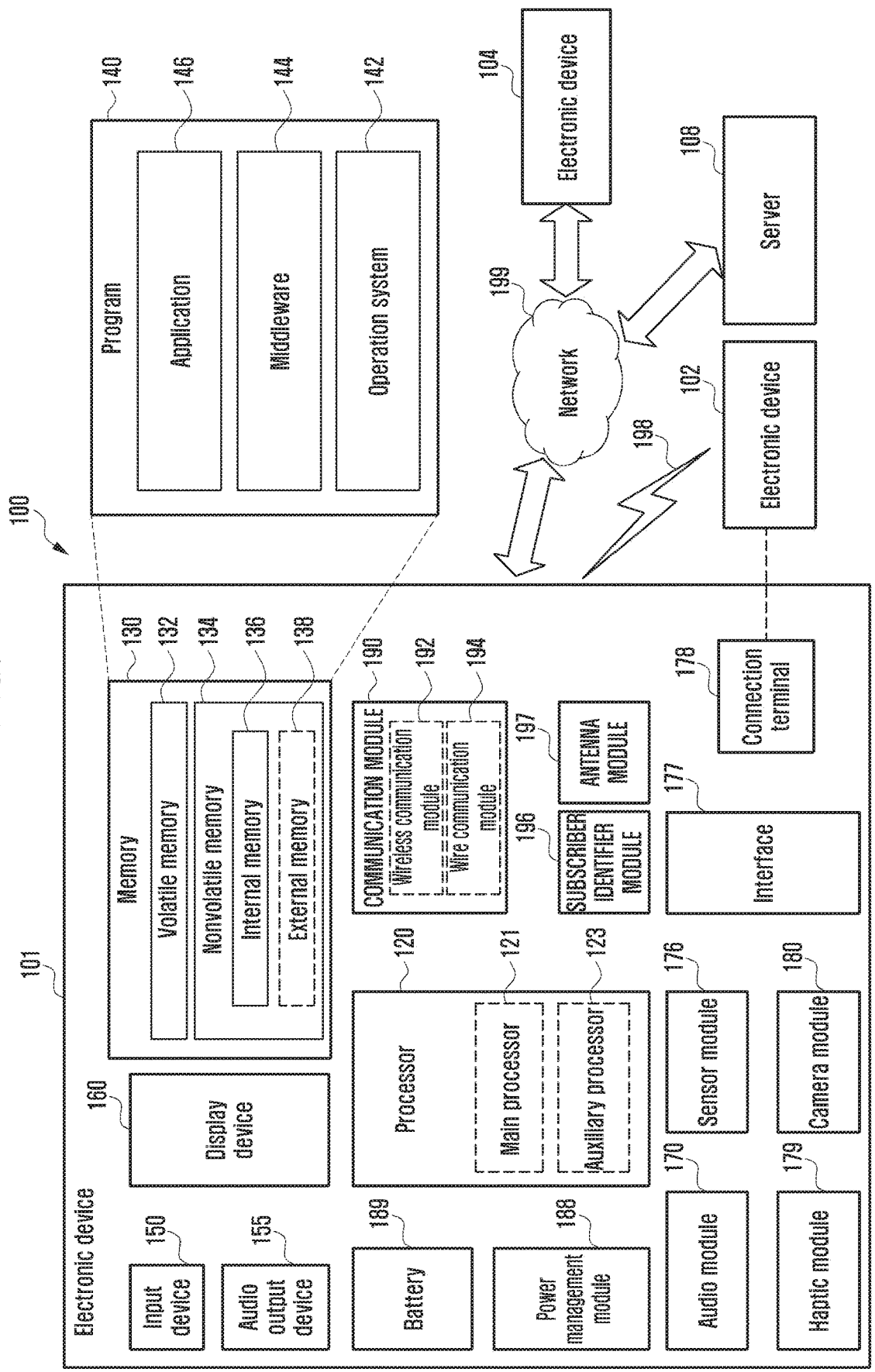
FIG. 1 is a block diagram illustrating a configuration of an electronic device in a network environment and having a display panel including an empty area enclosed by a display area according to an embodiment of the disclosure.

FIG. 1 is a block diagram illustrating an electronic device 101 in a network environment 100 according to an embodiment of the disclosure.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). The electronic device 101 may communicate with the electronic device 104 via the server 108. The electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. At least one (e.g., the display device 160 or the camera module 180) of the components may be omitted from the electronic device 101, or one or more other components may be added in the electronic device 101. Some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. As at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. The processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an ISP or a CP) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. The receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. The display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. The audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. The sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. The interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). The connecting terminal 178 may include, for example, an HDMI connector, a USB connector, an SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, ISPs, or flashes.

The power management module 188 may manage power supplied to the electronic device 101. The power management module 188 may be implemented as at least part of, for example, a power management integrated circuit (PMIC).

The battery 189 may supply power to at least one component of the electronic device 101. The battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more CP that are operable independently from the processor 120 (e.g., the AP) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, Wi-Fi direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., PCB). The antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. Another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

Commands or data may be transmitted or received between the electronic device 101 and the external electronic device 104 via the server 108 coupled with the second network 199. Each of the electronic devices 102 and 104 may be a device of the same type as, or a different type from, the electronic device 101. All or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Figure 2:
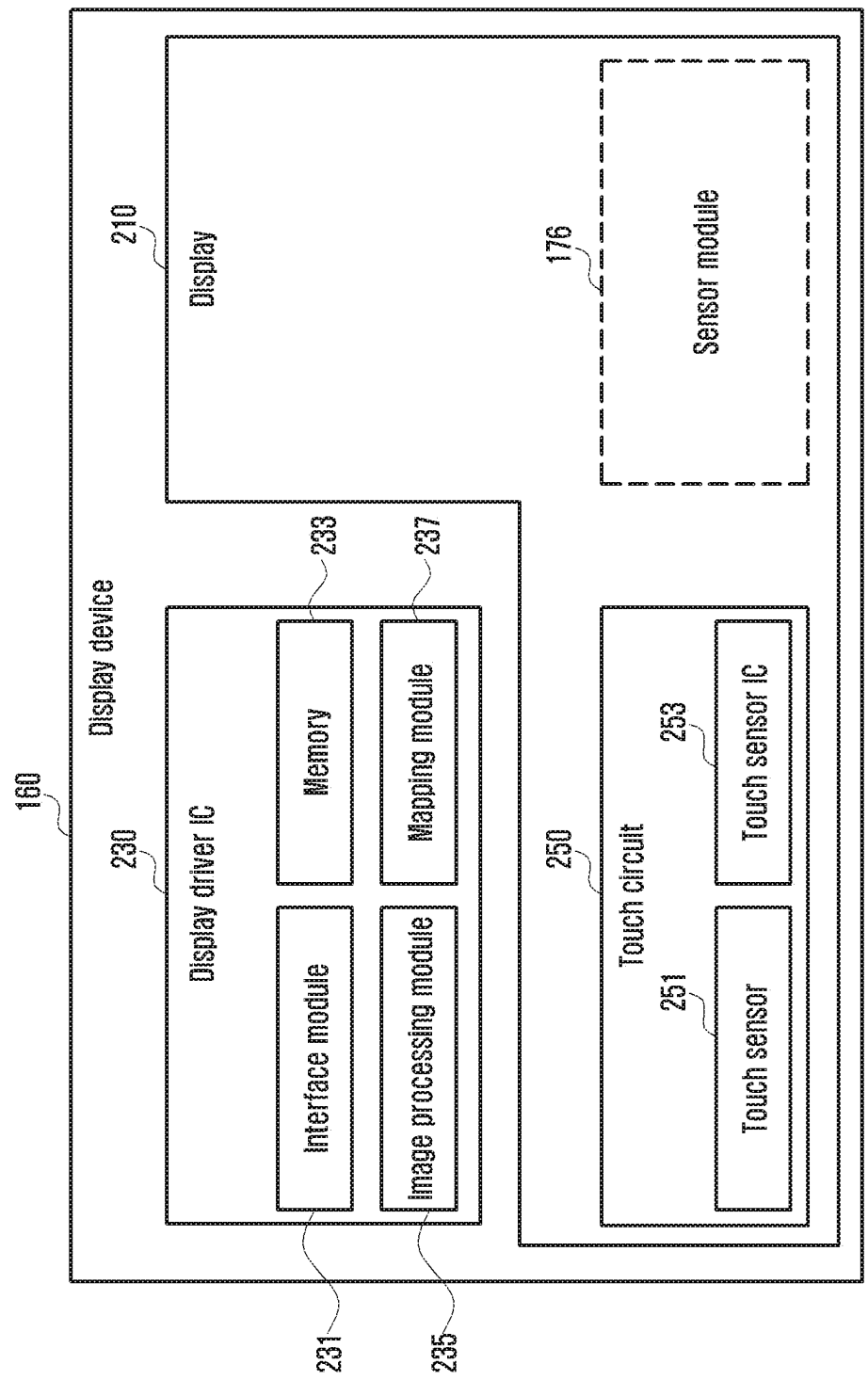
FIG. 2 is a block diagram illustrating a configuration of a display device according to an embodiment of the disclosure.

FIG. 2 is a block diagram illustrating the display device 160 according to an embodiment of the disclosure.

Referring to FIG. 2, the display device 160 may include a display 210 and a display driver integrated circuit (DDI) 230 to control the display 210. The DDI 230 may include an interface module 231, memory 233 (e.g., buffer memory), an image processing module 235, or a mapping module 237. The DDI 230 may receive image information that contains image data or an image control signal corresponding to a command to control the image data from another component of the electronic device 101 via the interface module 231. For example, the image information may be received from the processor 120 (e.g., the main processor 121 (e.g., an AP)) or the auxiliary processor 123 (e.g., a GPU) operated independently from the function of the main processor 121. The DDI 230 may communicate, for example, with touch circuitry 150 or the sensor module 176 via the interface module 231. The DDI 230 may also store at least part of the received image information in the memory 233 on a frame by frame basis.

The image processing module 235 may perform pre-processing or post-processing (e.g., adjustment of resolution, brightness, or size) with respect to at least part of the image data. The pre-processing or post-processing may be performed based at least in part on one or more characteristics of the image data or one or more characteristics of the display 210.

The mapping module 237 may generate a voltage value or a current value corresponding to the image data pre-processed or post-processed by the image processing module 235. The generating of the voltage value or current value may be performed based at least in part on one or more attributes of the pixels (e.g., an array, such as an RGB stripe or a pentile structure, of the pixels, or the size of each subpixel). At least some pixels of the display 210 may be driven based at least in part on the voltage value or the current value such that visual information (e.g., a text, an image, or an icon) corresponding to the image data may be displayed via the display 210.

The display device 160 may further include the touch circuitry 250. The touch circuitry 250 may include a touch sensor 251 and a touch sensor IC 253 to control the touch sensor 251. The touch sensor IC 253 may control the touch sensor 251 to sense a touch input or a hovering input with respect to a certain position on the display 210. To achieve this the touch sensor 251 may detect (e.g., measure) a change in a signal (e.g., a voltage, a quantity of light, a resistance, or a quantity of one or more electric charges) corresponding to the certain position on the display 210. The touch circuitry 250 may provide input information (e.g., a position, an area, a pressure, or a time) indicative of the touch input or the hovering input detected via the touch sensor 251 to the processor 120. At least part (e.g., the touch sensor IC 253) of the touch circuitry 250 may be formed as part of the display 210 or the DDI 230, or as part of another component (e.g., the auxiliary processor 123) disposed outside the display device 160.

The display device 160 may further include at least one sensor (e.g., a fingerprint sensor, an iris sensor, a pressure sensor, or an illuminance sensor) of the sensor module 176 or a control circuit for the at least one sensor. In such a case, the at least one sensor or the control circuit for the at least one sensor may be embedded in one portion of a component (e.g., the display 210, the DDI 230, or the touch circuitry 150)) of the display device 160. For example, when the sensor module 176 embedded in the display device 160 includes a biometric sensor (e.g., a fingerprint sensor), the biometric sensor may obtain biometric information (e.g., a fingerprint image) corresponding to a touch input received via a portion of the display 210. When the sensor module 176 embedded in the display device 160 includes a pressure sensor, the pressure sensor may obtain pressure information corresponding to a touch input received via a partial or whole area of the display 210. The touch sensor 251 or the sensor module 176 may be disposed between pixels in a pixel layer of the display 210, or over or under the pixel layer.

A display device (e.g., the display device 160 of FIG. 2) according to various embodiments of the disclosure may include, for example, a liquid crystal display (LCD), field emission display (FED), plasma display panel (PDP), or organic light emitting diode (OLED) display. For example, by displaying an image (or video) using an OLED that generates light by recombination of electrons and holes, the OLED display may drive a display screen with low consumption power while having a fast response speed.

The OLED display may include a display panel including a plurality of pixels arranged in a matrix form and a driving circuit that transfers an image data (e.g., red, green, and blue (RGB)) signal to each of a plurality of pixels to display an image. For example, the driving circuit may include a data driver that transfers image data signals through data lines (DL) connected to each pixel and a gate driver (or scan driver) (e.g., scan driving circuit) that transfers scan signals through scan lines (SL) connected to each pixel in order to activate each pixel so as to display an image according to the data signals. Hereinafter, an OLED display is exemplified, but the disclosure is not limited thereto and a driving circuit and a display enhancement structure according to various embodiments may be used.

Figure 3:
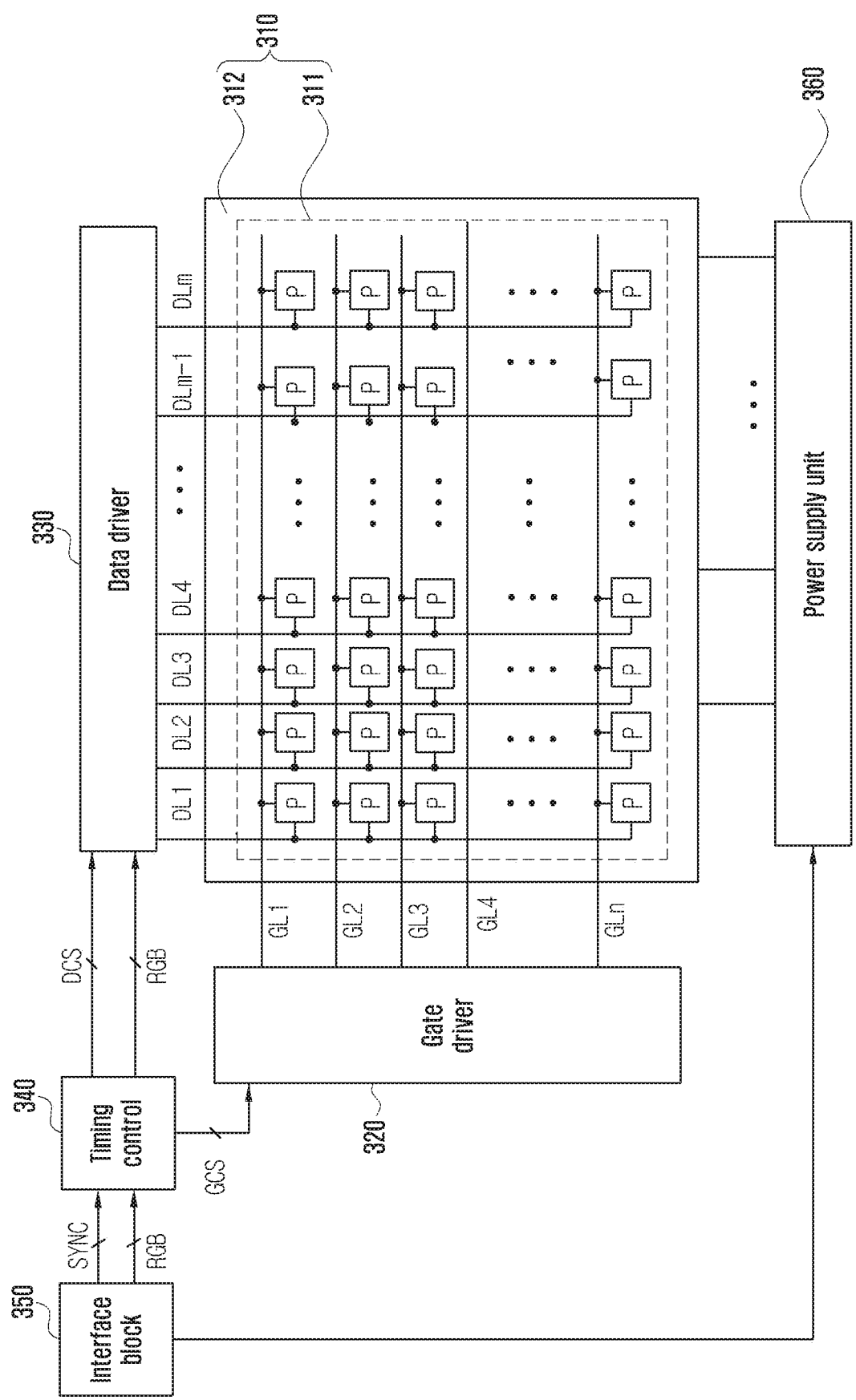
FIG. 3 is a diagram illustrating a display driving operation of a display device according to an embodiment of the disclosure s.

FIG. 3 is a diagram illustrating a display driving operation of a display device (e.g., the display device 160 of FIGS. 1 and 2) according to an embodiment of the disclosure.

Referring to FIG. 3, a display 310 of the display device may include a display area 311 that may output image data to the outside and a non-display area 312, which is an area other than the display area. For example, the display area 311 may mean an area that may output image data to the outside of the display device and in which a plurality of pixels is disposed. For example, the non-display area 312 may mean an area, except for the display area 311 among areas forming an external shape of the display device. The non-display area 312 may include an area in which a predetermined circuit element (e.g., gate driver, emission driver) and a wiring (e.g., scan line, data line, ELVDD wiring, ELVSS wiring) are disposed. The non-display area 312 may include an area in which a display driver IC (DDI) for applying signals to pixels of the display area 311 and/or wiring for electrically connecting the DDI (e.g., the DDI 230 of FIG. 2) and pixels are disposed. At least part of the wiring may be disposed in at least a partial area of the display area 311 as well as the non-display area 312.

For example, each pixel of the display area 311 may include at least one subpixel P. The display 310 may include a plurality of gate lines (GL) (e.g., GL1 to GLn) and a plurality of DL (e.g., DL1 to DLm) crossing each other. Subpixels P may be formed in an area in which the GL and the DL cross. Each subpixel P may include an OLED and at least one driving circuit for driving the OLED.

In order to drive the display 310, the display panel or the display driver circuit (e.g., the DDI 230 of FIG. 2) may include a gate driver 320, scan driver, or scan driving circuit; data driver 330 or data driver circuit; timing control 340; and interface block 350. The display area 311 may include a sensor hole area (not illustrated) in which at least one sensor (e.g., camera sensor, proximity sensor, infrared sensor) is disposed.

The driving circuit provided in each subpixel P may include at least one of at least one switch (e.g., thin film transistor (TFT) and at least one capacitor (e.g., storage capacitor (CST)) or light emitting element (e.g., OLED)).

At least one TFT may charge a data voltage supplied from the data line (DL) in a capacitor in response to a scan signal supplied from the GL. At least one TFT may control an amount of currents supplied to each subpixel P (e.g., OLED or liquid crystal) according to a data voltage charged in the capacitor.

The gate driver 320 may supply scan signals or scan pulses to a plurality of gate lines (GL1 to GLn) according to at least one gate control signal (GCS) provided from the timing control 340. The gate driver 320 may include a gate shift register for outputting scan signals. The scan signals are sequentially supplied to each pixel and may be configured with a single signal or a plurality of signals. When the scan signal is configured with a plurality of signals, each GL may be configured with a plurality of lines for supplying a plurality of scan signals to each pixel. For example, the gate driver 320 may be connected to a column line, which is a cathode terminal of the display 310 to select sequentially the corresponding column line.

The data driver 330 may convert image data (RGB) provided from the timing control 340 to a data voltage according to at least one data control signal (DCS) provided from the timing control 340. The data driver 330 may generate a data voltage using a plurality of gamma compensation voltage. The data driver 330 may supply the generated data voltage sequentially in a line unit (or row unit) to a plurality of pixels. The data driver 330 may include a data shift register for outputting a sampling signal, a latch circuit for latching image data (RGB) in a line unit in response to the sampling signal, and a digital analog converter (DAC) for converting the latched image data to an analog gradation voltage.

The timing control 340 may align image data (RGB) provided from the interface block 350 to correspond to a size and resolution of the display 310. The timing control 340 may supply the aligned image data (RGB) to the data driver 330. The timing control 340 may transmit a plurality of control signals (e.g., GCS, DCS) using at least one synchronization signal (SYNC) provided from the interface block 350. A plurality of control signals (e.g., GCS, DCS) may include at least one GCS and at least one DCS. The GCS may be a signal for controlling driving timing of the gate driver 320. The DCS may be a signal for controlling driving timing of the data driver 330. Synchronization signals (SYNC) may include a dot clock (DCLK), data enable signal (DE), horizontal synchronization signal (Hsync), or vertical synchronization signal (Vsync).

The interface block 350 may receive image data (RGB) from the processor (e.g., the processor 120 of FIG. 1) and transmit the received image data (RGB) to the timing control 340. The interface block 350 may generate at least one synchronization signal (SYNC) to transmit the generate SYNC to the timing control 340. The interface block 350 may control a power supply unit 360 (e.g., the power management module 188 of FIG. 1) to supply at least one driving voltage to the display 310.

The display panel of the display 310 may also include a backlight module (BLU) (not illustrated).

The power supply unit 360 may generate at least one driving voltage necessary for driving the display 310 and supply the generated driving voltage to the display 310. The power supply unit 360 is configured with a single unit or plural units to independently supply at least one driving voltage to an area (e.g., at least a partial area of the display area 311) in which at least one sensor is disposed. At least one driving voltage may include, for example, an ELVDD, ELVSS, gate-on voltage, gate-off voltage, or initialization voltage. The gate-on voltage may be a voltage for turning on at least one TFT provided in the display 310. The gate-off voltage may be a voltage for turning off at least one TFT provided in the display 310. The initialization voltage may be a voltage for initializing at least one node provided in a driving circuit for driving at least one subpixel P of a plurality of subpixels (P).

Figure 4:
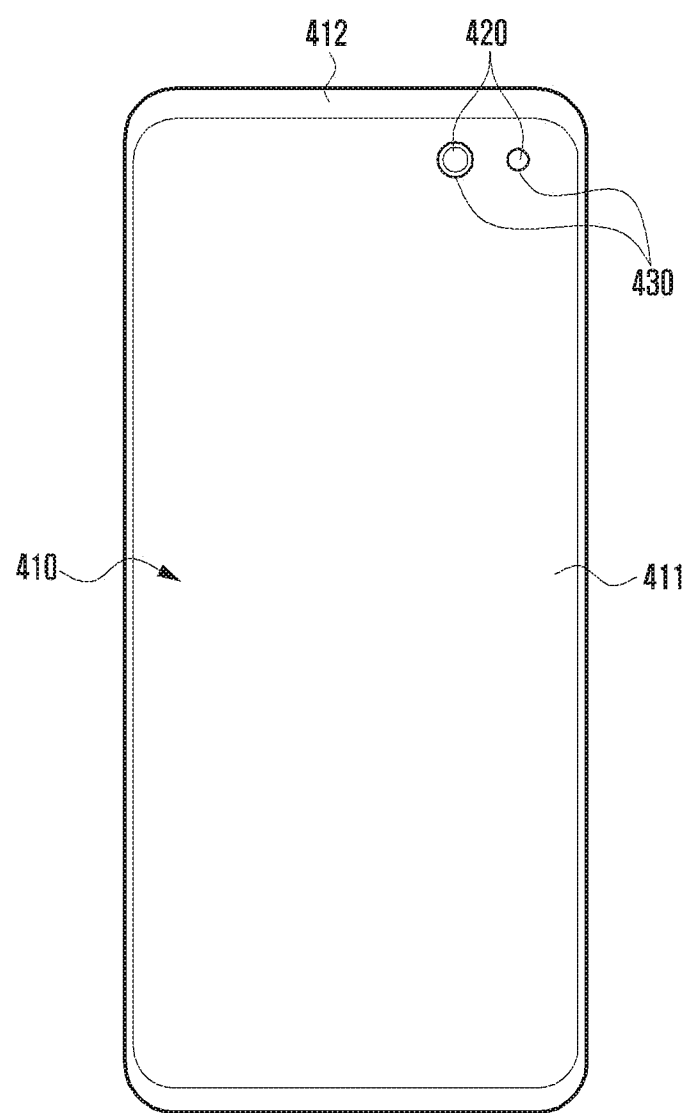
FIG. 4 is a front view illustrating a display device according to an embodiment of the disclosure.

FIG. 4 is a front view illustrating a display device (e.g., the electronic device 101 of FIG. 1 or the display device 160 of FIGS. 1 and 2) according to an embodiment of the disclosure.

Referring to FIG. 4, the display device may include a display 410 (e.g., the display 210 of FIG. 2, the display 310 of FIG. 3) that may output image data through at least a partial area of a front surface and/or a side surface.

For example, the display 410 may include a display area 411, which is an area in which image data are output and a non-display area 412, which is an area other than the display area.

The display area 411 may include an area in which a plurality of pixels is disposed. The non-display area 412 may mean an area, except for the display area 411 among areas forming an external shape of the display 410 of the display device.

For example, the non-display area 412 may include an area in which predetermined circuit elements (e.g., gate driver, emission driver) and wiring (e.g., scan line, data line, ELVDD wiring, ELVSS wiring) are disposed. The non-display area 412 may include an area in which a DDI for applying signals to pixels disposed in the display area 411 and/or elements and wirings for electrically connecting the DDI and the pixels are disposed.

The display device may include at least one empty area 430 (e.g., camera hole and/or sensor hole) for function implementation of a sensor or a camera 420 in the display area 411 or the non-display area 412 of the display 410. For example, as illustrated in FIG. 4, the display device may include the empty area 430 inside the display area 411. The empty area 430 may be formed to be enclosed by a plurality of pixels of the display area 411. For example, the empty area 430 may include an area in which pixels are not disposed among the display area 411 and enclosed by the pixels. According to another embodiment, the empty area 430 may mean an area in which a small number of pixels are disposed in the same area, compared to pixels of the display area 411.

In the empty area 430, the pixel (or subpixels) of the display area and at least one wiring (e.g., scan line, data line, EM line, ELVDD wiring, ELVSS wiring) electrically connected to the pixel may not be disposed.

Figure 5:
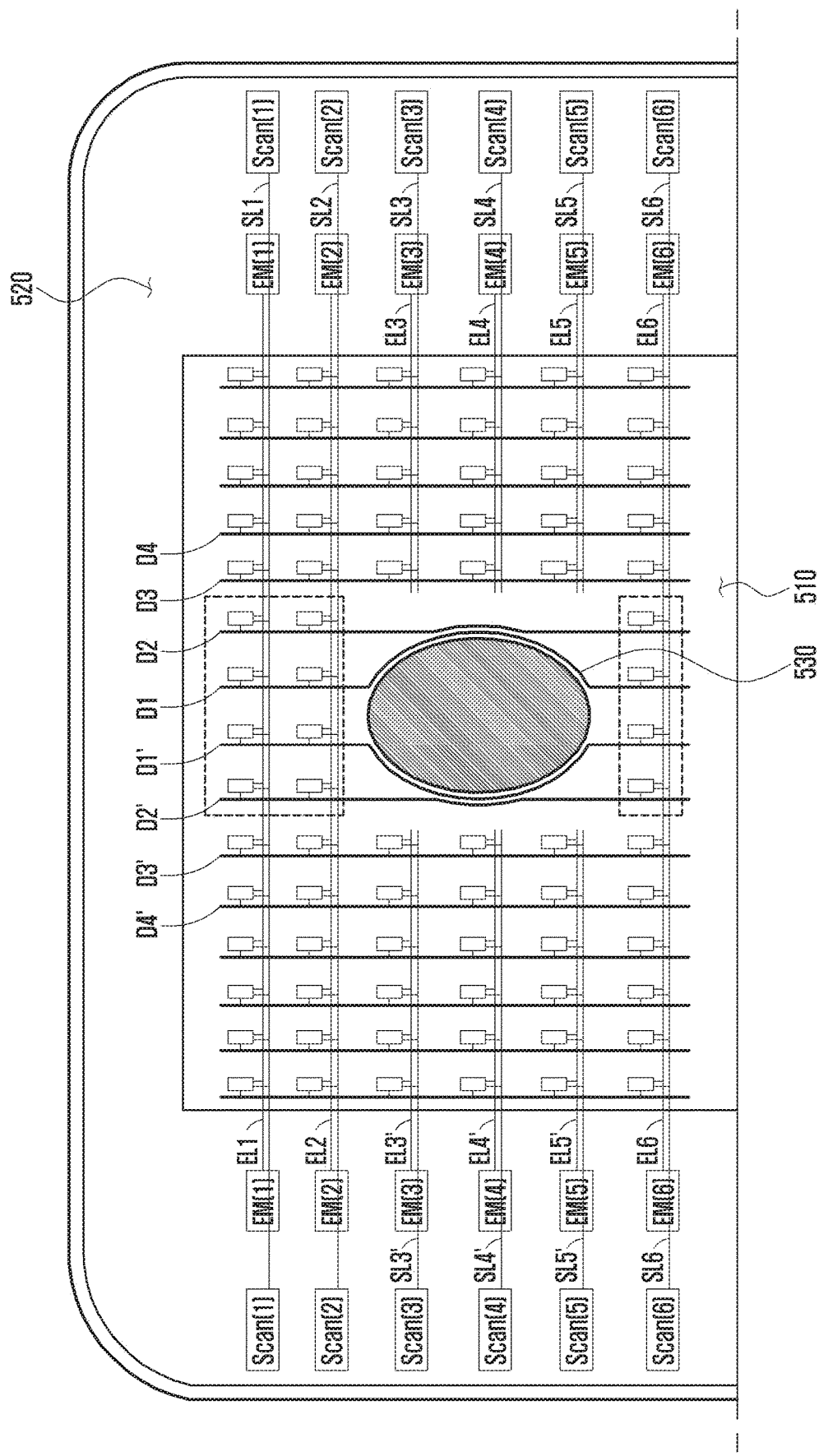
FIG. 5 is a diagram illustrating a structure in which wirings of a display panel are disposed to bypass an empty area in a display device according to an embodiment of the disclosure.

FIG. 5 is a diagram illustrating a structure in which wiring of a display panel are disposed to bypass an empty area in a display device (e.g., the electronic device 101, the display device 160) according to various embodiments of the disclosure.

Referring to FIG. 5, the display panel may include a display area 510 and a non-display area 520. For example, the display area 510 may include an area in which a plurality of pixels (or subpixels) is disposed, and the non-display area 520 may include an area in which predetermined circuit elements and wirings are disposed.

The display device may include a display driver circuit (not illustrated) (e.g., the DDI 230 of FIG. 2). The display driver circuit may apply a driving signal to the display panel. The display driver circuit may be connected electrically to wiring and pixels disposed in the display panel. The display driver circuit may receive image data to be output through the display through the processor and provide signals and power corresponding to the image data to the display panel.

The display panel may include scan driver circuits (scan (1), scan(2), ..., scan(6)) and at least one scan line (e.g., SL or gate lines) (SL1 to SL6, SL3' to SL5'). For example, the scan driving circuit may include a gate driver (or scan driver) (e.g., the gate driver 320 of FIG. 3).

For example, the scan driving circuit may be electrically connected to a display driver circuit (not illustrated) of the display device and be disposed in the non-display area 520 of the display panel. Further, the scan line may be connected to pixels extended from the scan driving circuit to be disposed in the display area 510.

The scan driving circuit may supply scan signals or a gate signal to the pixels of the display panel through the scan line (e.g., gate line or scan line). For example, the scan driving circuit may control a voltage of a gate terminal of the scan TFT based on the scan signals, thereby controlling light emission of each pixel. The scan driving circuit may be disposed at one side (e.g., left non-display area of the display device) of the display panel. As illustrated in FIG. 5, in order to prevent voltage drop of scan signals, the gate driver may be disposed at each of both sides (e.g., left and right non-display area of the display device) of the display panel to supply scan signals.

The display panel may further include power driving circuits (EM(1), EM(2), ..., EM(6)) and at least one power line (e.g., EM line) (EL1 to EL6, EL3' to EL5'). For example, the power driving circuit may include an emission driver.

For example, the power driving circuit (e.g., emission driver) may be connected electrically to the display driver circuit (not illustrated) of the display device and be disposed in the non-display area of the display panel. For example, the power line (e.g., EM line) may be connected to pixels extended from the power driving circuit to be disposed in the display area 510.

By applying light emission control signals (e.g., EM signals) to each pixel, the power driving circuit may control light emission timing of the pixel. The power driving circuit may be divided into a plurality of blocks. Each of the divided blocks may mean an emission driving block or an EM block. The power driving circuit may alternatively be included in the display driver circuit instead of the display panel.

The display panel may include a data driving circuit (data driver) (e.g., the data driver 330 of FIG. 3) and at least one data line (D1 to D4, D1' to D4') connected to pixels extended from the data driving circuit and disposed in the display area 510. For example, the data driving circuit may supply a data signal (or source signal) to each pixel (or subpixel) through a data line. The data driving circuit may apply a data signal to control light emission intensity of each pixel.

The display panel may include an empty area 530, which is an area in which pixels (or subpixels) are not disposed in at least part of the display area 510 and enclosed by the pixels on the display area 510.

At least one wiring (e.g., scan line, power line, and data line) used for supplying signals or power to the pixels may not be disposed in the empty area 530.

For example, as illustrated in FIG. 5, the at least one wiring may be disconnected (e.g., SL (SL3 to SL5, SL3' to SL5') and power lines (EL3 to EL5, EL3' to EL5')) in the vicinity of the empty area 530 or may be disposed (e.g., DL (D1, D2, D1', D2')) to bypass the empty area. For example, when at least one wiring is disposed in a portion of the empty area, the display device may further include an opaque member for shielding at least one wiring that bypasses the empty area.

According to another embodiment of the disclosure, at least part of the at least one wiring may be disposed in the empty area 530.

Figure 6A:
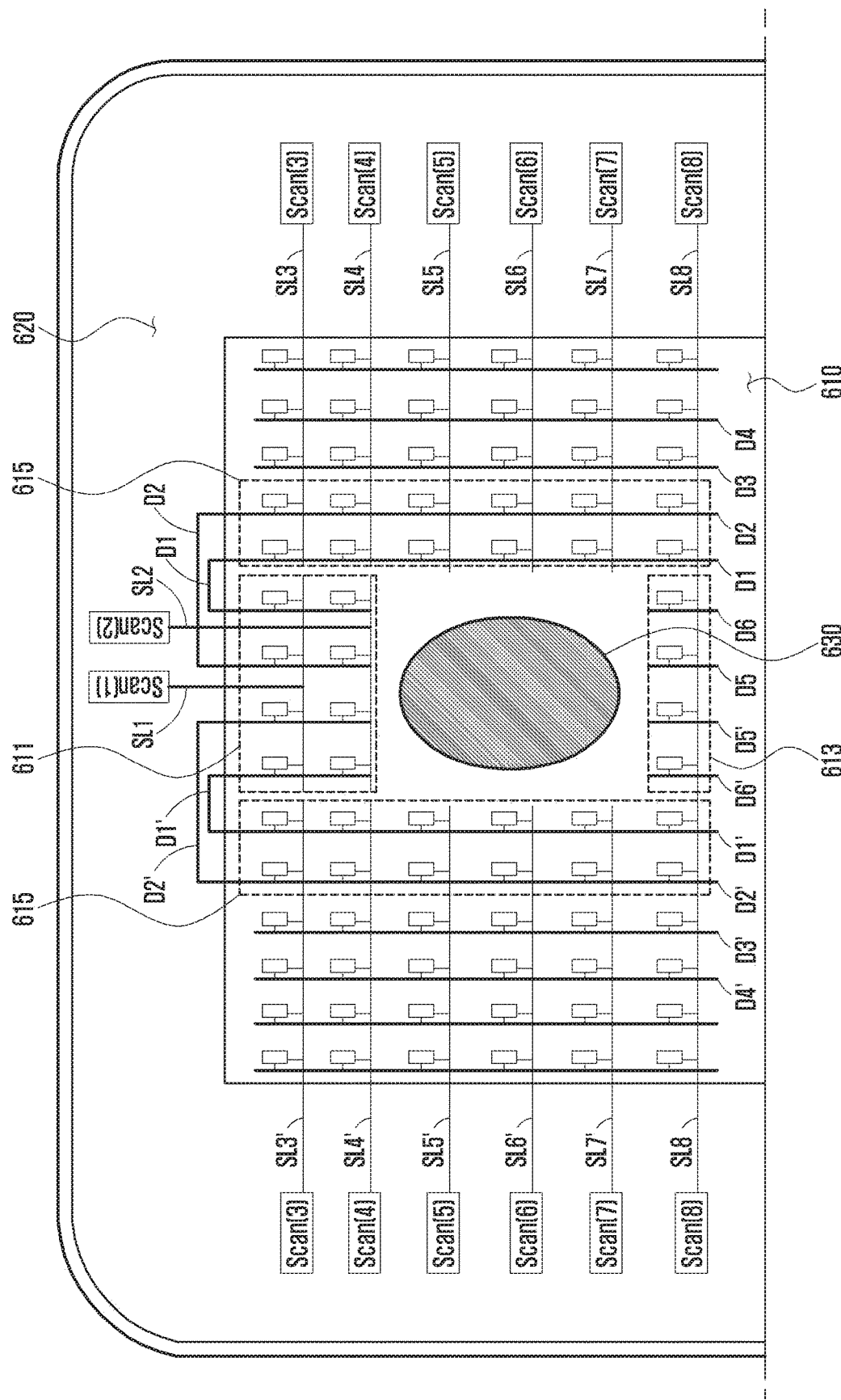
FIG. 6A is diagram illustrating a disposition structure of wirings of a display panel in a display device according to an embodiment of the disclosure.
Figure 6B:
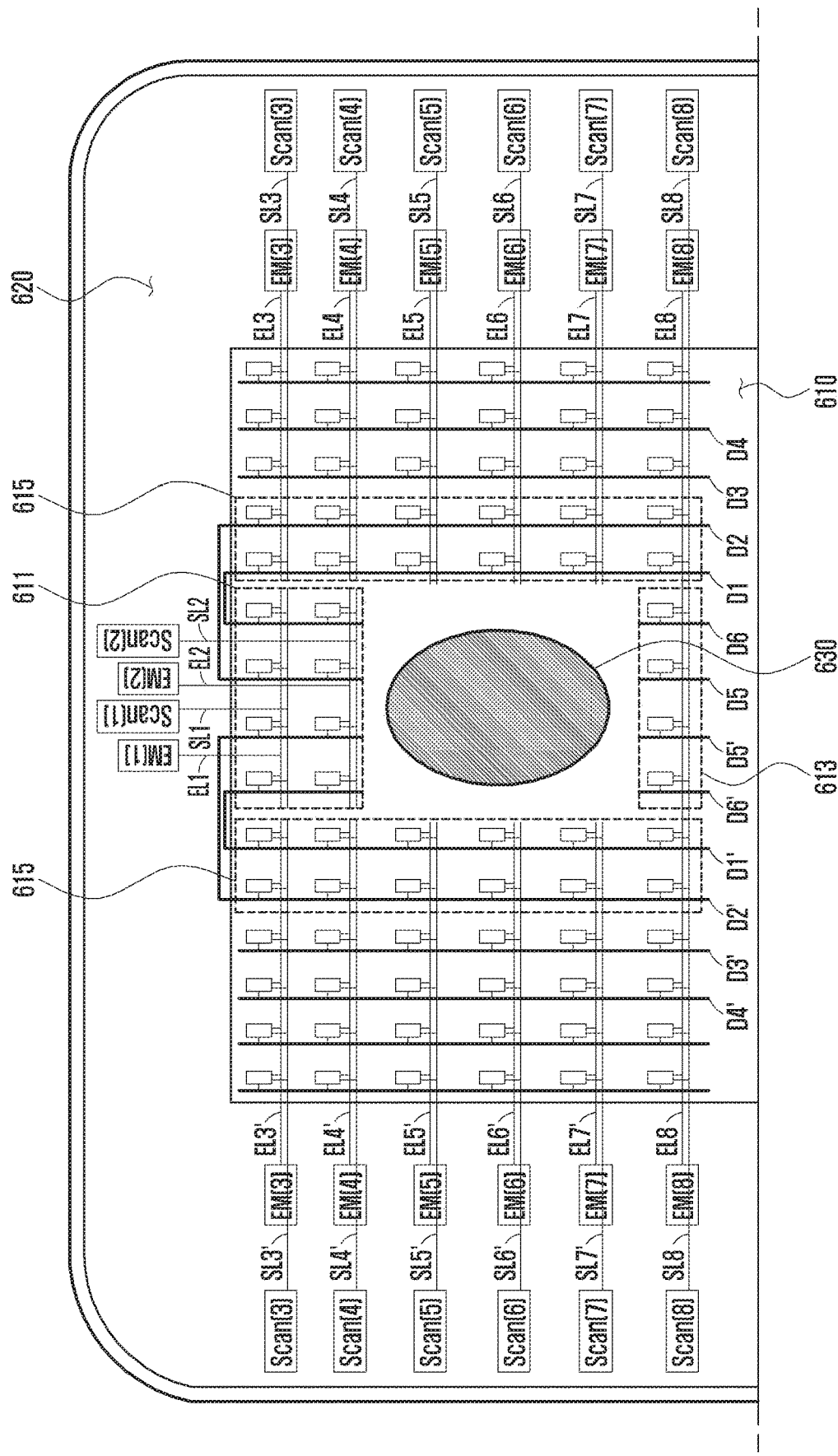
FIG. 6B is a diagram illustrating a disposition structure of wirings of a display panel in a display device according to an embodiment of the disclosure.

FIG. 6A is a diagram illustrating a disposition structure of wiring of a display panel in a display device (e.g., the electronic device 101, the display device 160) according to an embodiment of the disclosure, and FIG. 6B is a diagram illustrating a disposition structure of wiring of a display panel in a display device (e.g., the electronic device 101, the display device 160) according to an embodiment of the disclosure.

Referring to FIGS. 6A and 6B, the display panel may include a display area 610 including a plurality of pixels and a non-display area 620 formed outside the display area.

The display panel may further include an empty area 630 in which the plurality of pixels is not disposed in at least a partial area of the display area 610 and that is an area enclosed by a plurality of pixels of the display area 610. For example, the empty area 630 may correspond to a hole area in which a camera or a sensor included in the display device is disposed.

The display device may include a display driver circuit (not illustrated) for applying a driving signal to the display panel. The display driver circuit (not illustrated) may be disposed on the non-display area 620 of the display panel. For example, the display driver circuit may be disposed in a third partial area of the non-display area 620 and corresponding to the outside of a third side of the display area 610.

Referring to FIGS. 6A and 6B, a display panel may include first scan driving circuits (scan(3), scan(4), ..., scan(8)) electrically connected to the display driver circuit (not illustrated) of the display device and corresponding to the outside of a first side of the display area 610 and disposed in the first partial area of the non-display area 620. For example, the first partial area may include at least part of the non-display area 620 of the side (left side and/or right side) of the display device.

The display panel may include at least one first scan line (SL3 to SL8 and SL3' to SL7') extended towards the empty area 630 from the first scan driving circuits (scan(3), scan (4), . . . , scan(8)) to be connected to at least one pixel (e.g., first pixel) 615 and 613 of a plurality of pixels of the display area 610.

The display panel may further include second scan driving circuits (scan(1), scan(2)) corresponding to the outside of the second side adjacent to the first side of the display area 610 and disposed in the second partial area of the non-display area 620. The second partial area may include at least a partial area of the non-display area 620 of an upper surface of the display device.

The display panel may include at least one second scan line SL1 and SL2 extended towards the empty area 630 from the second scan driving circuits scan(1) and scan(2) to be connected to at least one pixel (e.g., second pixel) of a plurality of pixels 611.

The second scan driving circuits scan(1) and scan(2) may be electrically connected to the first scan driving circuits (scan(3), scan(4), . . . , scan(8)).

For example, the first scan driving circuits (scan(3), scan(4), . . . , scan(8)) and the second scan driving circuits scan(1) and scan(2) receive driving signals from the display driver circuit (not illustrated) of the display device to transfer the driving signals to each pixel through the first scan line or the second scan line. A first scan signal for driving the first scan driving circuits (scan(3), scan(4), . . . , scan(8)) and a second scan signal for driving the second scan driving circuits scan(1) and scan(2) may be separated and transmitted into separate signals from the display driver circuit.

The display panel may further include a switch that may connect or disconnect the first scan line and the second scan line and may separate and transfer a first scan signal and a second scan signal using the switch.

A pixel and a wiring (e.g., data line) may not be disposed in the empty area 630 of the display panel.

At least one pixel 611 disposed at one side (e.g., upper side) of the empty area 630 and at least one pixel 613 disposed at the other side (e.g., lower side) of the empty area 630 may be connected to the display driver circuit (or data driving circuit (data driver)) through different DL.

For example, at least one first pixel 615 on an area corresponding to the first side based on the empty area 630 may be connected to the display driver circuit through at least one first data line (D1 to D4, D1' to D4').

For example, at least one second pixel 611 on an area corresponding to the second side based on the empty area 630 may be connected to the display driver circuit through at least part (D1, D2, D1', D2') of at least one first data line (D1 to D4, D1' to D4').

In order to connect each of at least part of the first pixel 615 and at least part of the second pixel 611 to the display driver circuit, at least part of the at least one first data line may be disposed in a form passing through an area corresponding to the second side among the non-display area 620. For example, an area corresponding to the second side through which at least part of the first data line passes may include at least part of a second partial area of the non-display area 620 in which the second scan driving circuits scan(1) and scan(2) are disposed or at least part of a partial area of the non-display area 620 through which at least one scan line SL1 and SL2 extended from the second scan driving circuits scan(1) and scan(2) passes.

At least part of at least one third pixel 613 on an area corresponding to the third side based on the empty area 630 may be connected to the display driver circuit through third DL (D5, D6, D5', and D6').

In the display panel, because pixels of the second side (e.g., an upper area of the empty area 630) and the third side (e.g., a lower area of the empty area 630) of the empty area 630 may be connected to the display driver circuits through different DL, in order to connect the pixels of the second side and the third side of the empty area 630 through the same data line, an effective display area may be increased relatively in which pixels are disposed in the display area 610, compared to a structure in which the data line is disposed to bypass the empty area 630.

At least one first pixel 615 and at least one second pixel 611 may receive the same data signal through any one of at least one first data line (D1, D2, D1', and D2').

For example, the at least one first pixel 615 may receive a first scan signal from the first scan driving circuits (scan(3), scan(4), . . . , scan(8)) through at least one first scan line. Further, the at least one second pixel 611 may receive a second scan signal from the second scan driving circuits scan(1) and scan(2) through at least one second scan line.

Even if the at least one first pixel 615 and the at least one second pixel 611 receive the same data signal through have the same data line, by separating and transmitting the first scan signal and the second scan signal into separate signals from the display driver circuit, the display panel may control by sequentially dividing driving of the at least one first pixel 615 and the at least one second pixel 611.

The display panel may further include first power driving circuits (EM(3), EM(4), . . . , EM(8)) and second driver circuits EM(1) and EM(2), as illustrated in FIG. 6B. For example, the first power driving circuits (EM(3), EM(4), . . . , EM(8)) may be disposed on a first partial area of a non-display area, which is an area in which the first scan driving circuits (scan(3), scan(4), . . . , scan(8)) are disposed. The second power driver circuits EM(1) and EM(2) may be disposed on a second partial area of a non-display area, which is an area in which the second scan driving circuits scan(1) and scan(2) are disposed.

The display panel may further include at least one first power line (EL3 to EL8 and EL3' to EL7') and at least one second power line EL1 and EL2, as illustrated in FIG. 6B. For example, the at least one first power line (EL3 to EL8 and EL3' to EL7') may be extended towards the empty area 630 from the first power driving circuit (EM(3), EM(4), . . . , EM(8)) to be connected at least one first pixel 615 and 613 connected to the at least one first SL (SL3 to SL8 and SL3' to SL7'). For example, the at least one second power line EL1 and EL2 may be extended towards the empty area 630 from the second power driving circuits EM(1) and EM(2) to be connected to at least one second pixel 611 connected to the at least one second SL SL1 and SL2.

Figure 7A:
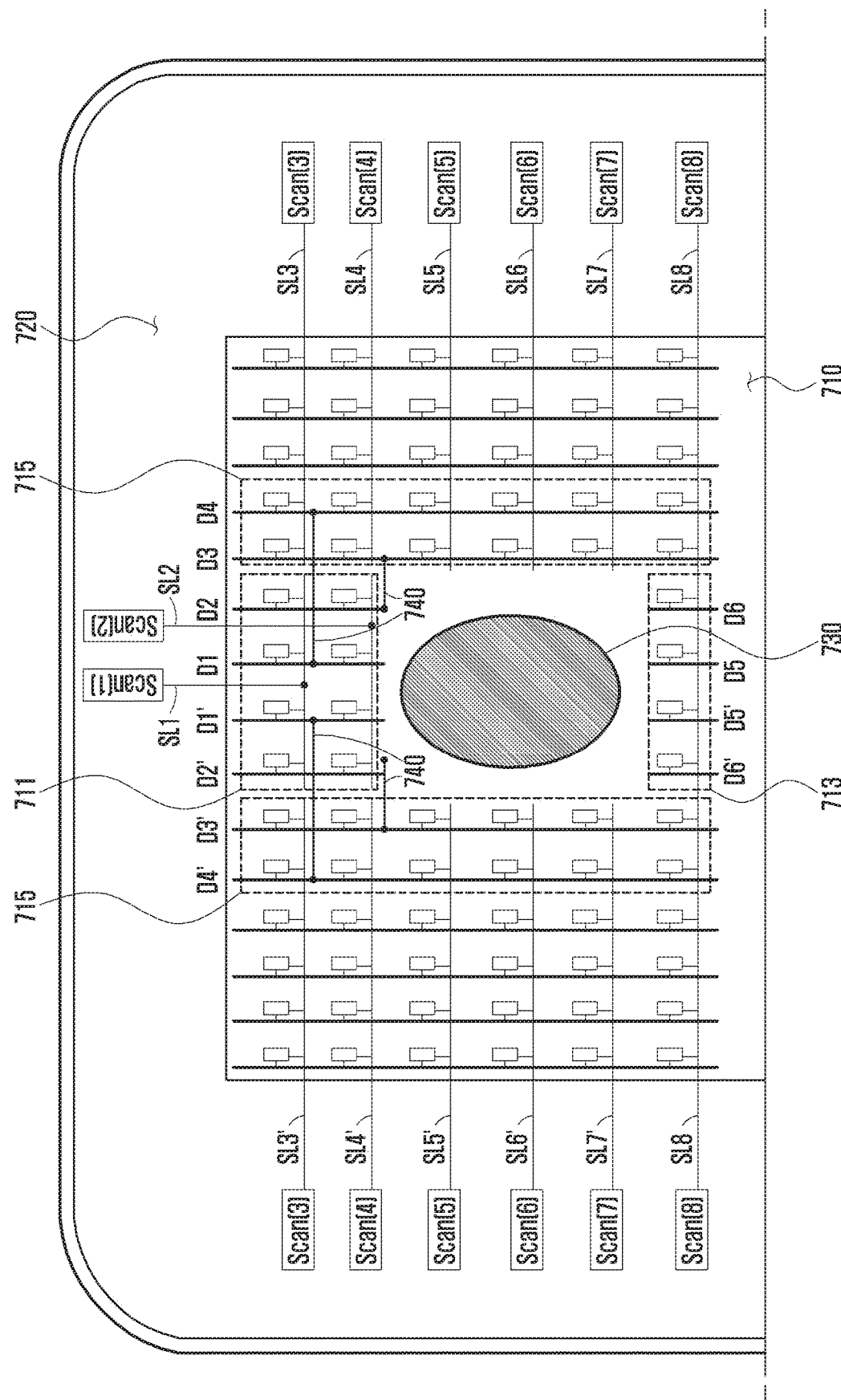
FIG. 7A is a diagram illustrating a disposition structure of wirings of a display panel in a display device according to an embodiment of the disclosure.

FIG. 7A is a diagram illustrating a disposition structure of wirings of a display panel in a display device (e.g., the electronic device 101, the display device 160) according to an embodiment of the disclosure.

Referring to FIG. 7A, the display panel may include a display area 710 including a plurality of pixels and a non-display area 720 formed outside the display area.

The display panel may further include an empty area 730 in which the plurality of pixels is not disposed in at least part of the display area 710 and that is an area enclosed by the plurality of pixels. For example, the empty area 730 may correspond to a hole area in which a camera or a sensor included in the display device is disposed.

The display device may include a display driver circuit (not illustrated) for applying a driving signal to the display panel. According to an embodiment, the display driver circuit (not illustrated) may be disposed on the non-display area 720 of the display panel. For example, the display driver circuit may be disposed in a third partial area of the non-display area 720 corresponding to the outside of the third side of the display area 710.

The display panel may include first scan driving circuits (scan(3), scan(4), . . . , scan(8)) electrically connected to the display driver circuit (not illustrated) of the display device and corresponding to the outside of a first side of the display area 710 and disposed in a first partial area of the non-display area 720. For example, the first partial area may mean at least a partial area of the non-display area 720 of the left side and/or the right side of the display device.

The display panel may include at least one first scan line (SL3 to SL8 and SL3' to SL7') extended towards the empty area 730 of the display panel from the first scan driving circuits (scan(3), scan(4), . . . , scan(8)) to be connected to at least one pixel (e.g., the first pixel) 715 and 713 of a plurality of pixels of the display area 710.

The display panel may further include second scan driving circuits scan(1) and scan(2) corresponding to the outside of the second side adjacent to the first side of the display area 710 and disposed on a second partial area of the non-display area 720. The second partial area may mean at least a partial area of the non-display area 720 of an upper surface of the display device.

The display panel may further include at least one second scan line SL1 and SL2 extended towards the empty area 730 from the second scan driving circuits scan(1) and scan(2) to be connected to at least one pixel (e.g., a second pixel 711) of a plurality of pixels of the display area 710.

Although not illustrated, the second scan driving circuits scan(1) and scan(2) may be electrically connected to the first scan driving circuits (scan(3), scan(4), . . . , scan(8)) For example, the first scan driving circuits (scan(3), scan(4), . . . , scan(8)) and the second scan driving circuits scan(1) and scan(2) may receive driving signals from the display driver circuit (not illustrated) of the display device to transfer the driving signals to each pixel through the first SL (SL3 to SL8 and SL3' to SL7') and the second SL SL1 and SL2.

first scan signal for driving the first scan driving circuits (scan(3), scan(4), . . . , scan(8)) and a second scan signal for driving the second scan driving circuits scan(1) and scan(2) may be separated and transmitted into separate signals from the display driver circuit.

A pixel and a wiring may not be disposed in the empty area 730 of the display panel according to various embodiments.

At least one pixel 711 disposed at one side (e.g., upper side) of the empty area 730 and at least one pixel 713 disposed at the other side (e.g., lower side) of the empty area 730 may be connected to a display driver circuit (or a data driving circuit (data driver)) through different DL.

For example, at least one first pixel 715 on the area corresponding to the first side based on the empty area 730 of the display panel may be connected to the display driver circuit through at least one first data line (D3, D4, D3', and D4').

At least one second pixel 711 on an area corresponding to the second side based on the empty area 730 may be connected to the display driver circuit through at least one second data line (D1, D2, D1', and D2').

At least one third pixel 713 on an area corresponding to the third side based on the empty area 730 may be connected to the display driver circuit through at least one third data line (D5, D6, D5', and D6').

The display panel may further include at least one connecting wiring for connecting at least one first data line (D3, D4, D3', and D4') and at least one second data line (D1, D2, D1', and D2').

For example, any one of the first DL (D3, D4, D3', and D4') and any one of the second DL (D1, D2, D1', and D2') may be connected to each other through a connecting wiring.

At least one second pixel 711 connected to the second data line may receive data signals transmitted from the display driver circuit through the first data line, a connection wiring for connecting the first data line and the second data line, and the second data line.

At least part of the first pixel 715 and at least part of the second pixel 711 may receive the same data signal through the connection wiring. However, at least part of the first pixel 715 may receive a first scan signal from the first scan driving circuits (scan(3), scan(4), . . . , scan(8)) through at least one first scan line (SL3 to SL8 and SL3' to SL7'), and at least part of the second pixel 711 may receive a second scan signal from the second scan driving circuits scan(1) and scan(2) through the second SL SL1 and SL2.

By separating and transmitting the first scan signal and the second signal into separate signals from the display driver circuit, the display panel according to various embodiments may control by sequentially dividing driving of at least part of the first pixel 715 and at least part of the second pixel 711.

Although not illustrated, the display panel may further include first power driving circuits (EM(3), EM(4), . . . , EM(8)) and second driver circuits EM(1) and EM(2). For example, the first power driving circuits (EM(3), EM(4), . . . , EM(8)) may be disposed on a first partial area of a non-display area, which is an area in which the first scan driving circuits (scan(3), scan(4), . . . , scan(8)) are disposed. For example, the second power driver circuits EM(1) and EM(2) may be disposed on a second partial area of a non-display area, which is an area in which the second scan driving circuits scan(1) and scan(2) are disposed.

The display panel may further include at least one first power line (EL3 to EL8 and EL3' to EL7') and at least one second power line EL1 and EL2. For example, the at least one first power line (EL3 to EL8 and EL3' to EL7') may be connected to at least one first pixel 715 extended towards the empty area 730 from the first power driving circuits (EM(3), EM(4), . . . , EM(8)) to be connected to the at least one first scan line (SL3 to SL8 and SL3' to SL7'). For example, the at least one second power line EL1 and EL2 may be connected to the at least one second pixel 711 extended towards the empty area 630 from the second power driving circuits EM(1) and EM(2) to be connected to the at least one second SL SL1 and SL2.

Figure 7B:
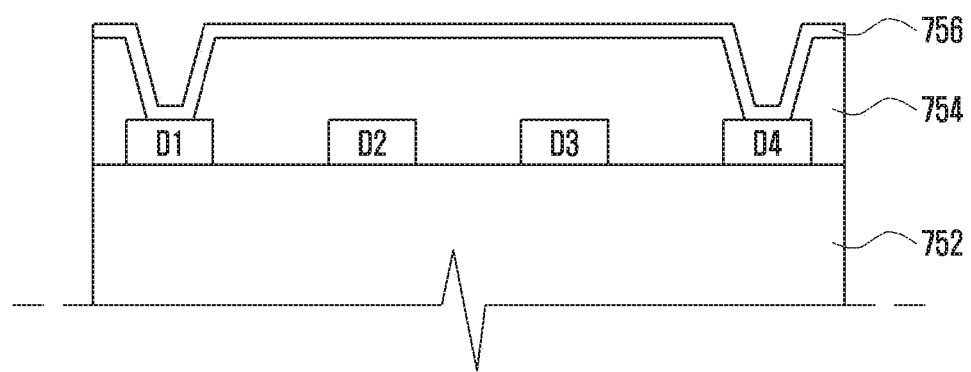
FIG. 7B is a side cut-away view of a display panel illustrating a structure of a connection wiring according to an embodiment of the disclosure.

FIG. 7B is a side cut-away view of a display panel illustrating a structure of a connection wiring according to various embodiments of the disclosure.

Referring to FIG. 7B, at least part of the connection wiring 756 may be formed in a layer different from a single surface layer in which the DL (D1, D2, D3, and D4) are disposed on the substrate 752.

For example, in order to distinguish the DL D1 and D4 to which the connection wiring 756 is to be connected and the other DL D2 and D4 and to transfer a data signal, the connection wiring 756 may be formed in a separate layer separated through an insulating film 754.

Figure 8:
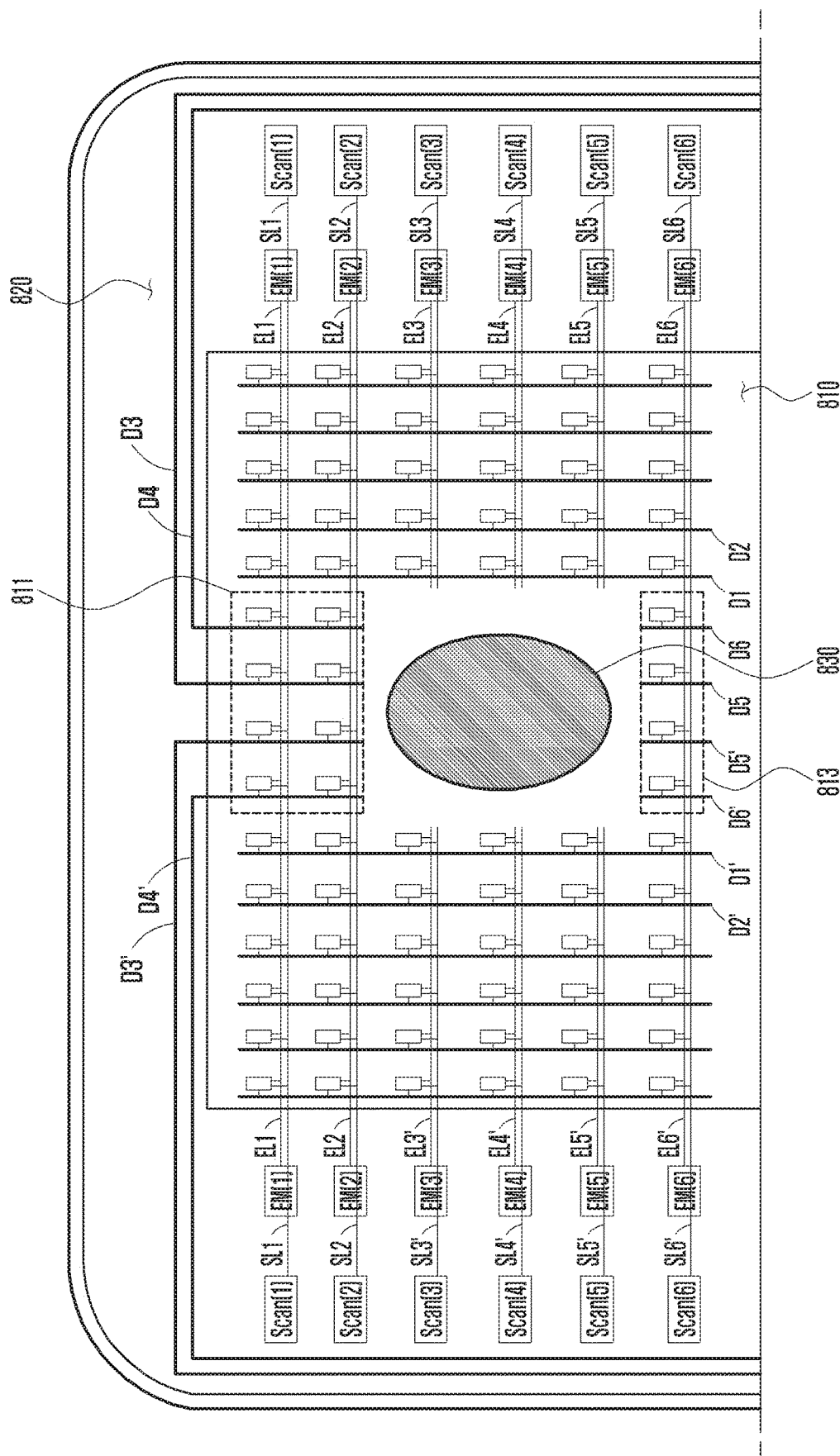
FIG. 8 is a diagram illustrating a disposition structure of wirings of a display panel in a display device according to an embodiment of the disclosure.

FIG. 8 is a diagram illustrating a disposition structure of wirings of the display panel in a display device (e.g., the electronic device 101, the display device 160) according to an embodiment of the disclosure.

Referring to FIG. 8, the display panel may include a display area 810 including a plurality of pixels and a non-display area 820 formed outside the display area.

The display panel may further include an empty area 830 in which the plurality of pixels is not disposed in at least part of the display area 810 and enclosed by the plurality of pixels. For example, the empty area 830 may correspond to a hole area in which a camera or a sensor included in the display device is disposed.

The display device may include a display driver circuit (not illustrated) for applying a driving signal to the display panel. The display driver circuit (not illustrated) may be disposed on the non-display area 820 of the display panel.

The display panel may include scan driving circuits (scan(1), scan(2), . . . , scan(6)) electrically connected to the display driver circuit (not illustrated) and disposed in the non-display area 820. For example, the display panel may include at least one scan line (SL1 to SL6, SL3' to SL5') extended from the scan driver circuits (scan(1), scan(2), . . . , scan(6)) to be connected to the plurality of pixels of the display area 810.

A pixel and a wiring (e.g., data line) may not be disposed in the empty area 830 of the display panel.

For example, at least one pixel 811 disposed at one side (e.g., upper side) of the empty area 830 may be connected to the display driver circuit (or data driver circuit (data driver)) through DL (e.g., first DL D1, D2, D5, D6, D1', D2', D5', and D6')) and the other DL (e.g., second DL D3, D4, D3', and D4') connected to at least one pixel 813 disposed at the other side (e.g., the lower side and/or the left side and the right side) of the empty area 830.

At least one first pixel 813 on an area corresponding to the first side (e.g., the lower side and/or the left side and the right side) based on the empty area 830 may be connected to the display driver circuit (or data driver circuit) through at least one first data line (D1, D2, D5, D6, D1', D2', D5', and D6') to receive data signals.

At least one second pixel 811 on the area corresponding to a second side (e.g., upper side) adjacent to the first side based on the empty area 830 may be connected to the display driver circuit (or data driver circuit) through at least one second data line (D3, D4, D3', and D4') to receive data signals. For example, the second side may be an area adjacent to the empty area 830 and may be an area of a distance farther than the empty area 830 based on the display driver circuit.

The first DL (D1, D2, D5, D6, D1', D2', D5', and D6') may be extended towards the empty area 830 from a display driver circuit (not illustrated) to be connected to the at least one first pixel 813. The second DL (D3, D4, D3', and D4') may be extended from the display driver circuit (not illustrated) to be connected to the at least one second pixel 811 through the non-display area.

When the second DL (D3, D4, D3', and D4') are extended towards the empty area 830 from the display driver circuit (not illustrated), the second DL (D3, D4, D3', and D4') may be disposed to pass through the empty area 830 or to bypass the empty area 830 in an adjacent portion of the empty area 830.

The second DL (D3, D4, D3', and D4') may be extended from the display driver circuit (not illustrated) to be disposed to pass through the empty area 830 or to pass through the non-display area 820 instead of bypassing in an adjacent area to be connected to the at least one second pixel 811, thereby being designed to maximize an effective display area in which pixels are disposed in the vicinity of the empty area 830 among the display area 810. For example, the second data line may pass through each of the side surface non-display area 820 and the upper surface non-display area 820 of the display device to connect at least one second pixel 811 and the display driver circuit.

The display panel may further include power driving circuits (EM(1), EM(2), . . . , EM(6)) connected electrically to the display driver circuit and disposed on the non-display area 830 and at least one power line (EL1 to EL6, EL3' to EL5') extended from the power source driving circuits (EM(1), EM(2), . . . , EM(6)) to be connected to the plurality of pixels.

FIG. 8 illustrates that the display panel includes the power driving circuits (EM(1), EM(2), . . . , EM(6)) and at least one power line, but the power driving circuits (EM(1), EM(2), . . . , EM(6)) and at least one power line may not be included according to the design of the display panel.

Figure 9:
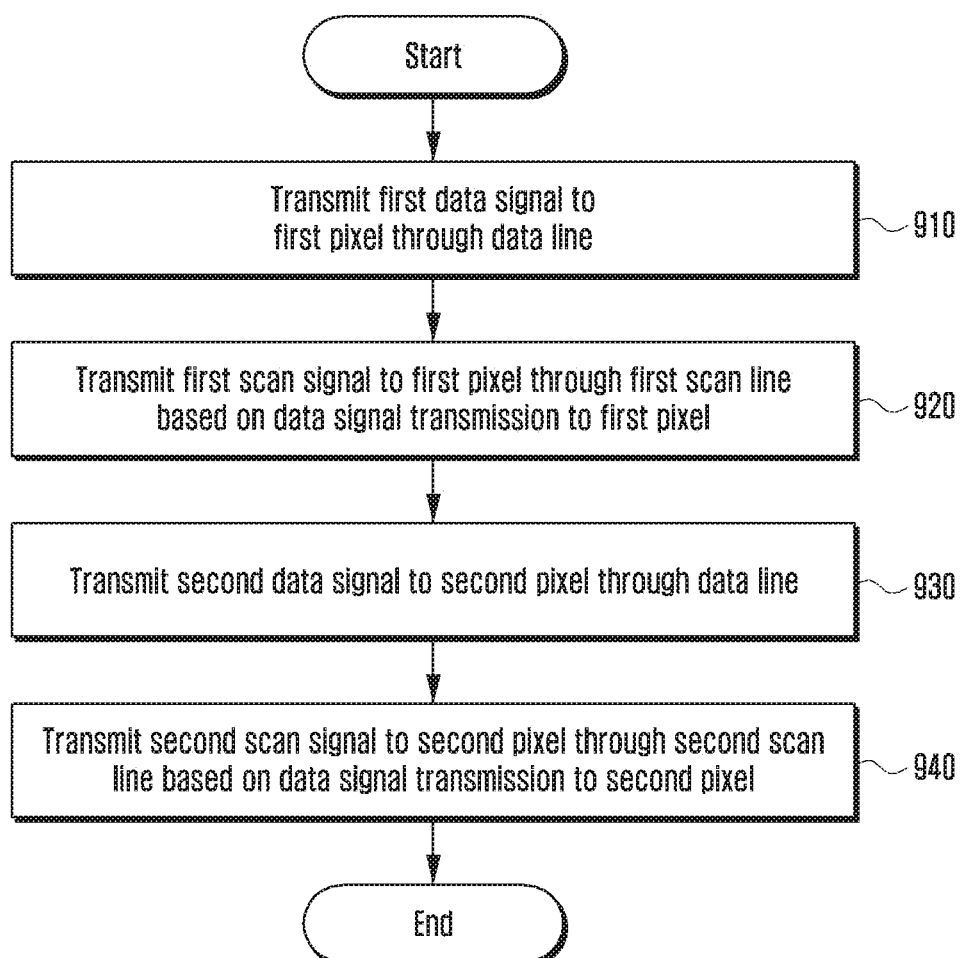
FIG. 9 is a flowchart illustrating a method of driving a display device according to an embodiment of the disclosure.

FIG. 9 is a flowchart illustrating a method of driving a display device according to an embodiment of the disclosure.

Referring to FIG. 9, the display device may supply an electrical signal to a plurality of pixels using a display driver circuit and a plurality of wirings to output image information through the pixels.

For example, the display device may include a display driver circuit and a display panel, and the display panel may include a plurality of pixels including at least one first pixel and at least one second pixel on a display area.

At least one first pixel may be connected to a first scan driving circuit through at least one first scan line. Further, at least one second pixel may be connected to a second scan driving circuit through at least one second scan line.

At least part of the at least one first pixel and at least part of the at least one second pixel may be connected through a data line. For example, the data line may be extended from the display driver circuit to electrically connect at least part of the at least one first pixel and at least part of at least one second pixel.

Referring to FIG. 9, at operation 910, the display driver circuit may transmit a first data signal to at least part of the at least one first pixel through the data line.

For example, at least part of the at least one first pixel may receive a first data signal transmitted from the display driver circuit through the data line.

At operation 920, the display driver circuit and/or the first scan driving circuit electrically connected to the display driver circuit may transmit a first scan signal to the at least one first pixel through the first scan line connecting the at least one first pixel and the first scan driving circuit.

For example, the first scan signal may be transmitted based on transmission of the first data signal to a first pixel of at least part connected to the data line among the at least one first pixel. The first pixel of at least part may output image information according to the first data signal and the first scan signal.

At operation 930, the display driver circuit according to various embodiments may transmit a second data signal to at least part of at least one second pixel connected through the data line.

For example, at least part of the at least one second pixel may receive a first data signal transmitted from the display driver circuit through the data line. The data line may be disposed on a single layer, and two wirings disposed on the single layer may be formed in a structure connected by a connection wiring connecting through another layer.

At operation 940, the display driver circuit and/or the first scan driving circuit electrically connected to the display driver circuit may transmit a second scan signal to at least one second pixel through the second scan line for connecting the at least one second pixel and the second scan driving circuit.

For example, the second scan signal may be transmitted based on transmission of the second data signal to the second pixel of at least part connected to the data line among the at least one second pixel. The second pixel may output image information according to the second data signal and the second scan signal.

Even though at least part of the at least one first pixel and at least part of at least one second pixel are connected through a single data line or are electrically connected using a connection wiring, the display device may adjust image information output according to the first scan signal and the second scan signal separated and transmitted from the display driver circuit based on data signals (the first data signal and the second data signal) received by each pixel.

The first pixel and the second pixel of FIG. 9 indicate at least part of a plurality of pixels of the display device and are not limited to a meaning of the first pixels 613, 615, 713, 715, and 813 or the second pixels 611, 711, and 811 of FIGS. 6A to 8. For example, unlike that illustrated in FIG. 9, in the display device, operations 930 and 940 of FIG. 9 may be first performed and then operations 910 and 920 may be performed.

The electronic device may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments of the disclosure as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

A method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

Each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. A display device, comprising:
    a display driver integrated circuit (IC);
    a display panel comprising:
        a display area, defined by a first edge, second edge, third edge, and fourth edge, and comprising a plurality of pixels,
        a non-display area formed beyond the first to fourth edges of the display area,
        a sensor area surrounded by pixels of the display area, wherein the sensor area comprises no pixels therein,
        a first scan driving circuit disposed in the non-display area beyond the first edge of the display area, and electrically connected to the display driver IC, and
        a second scan driving disposed in the non-display area beyond the second edge of the display area, and electrically connected to the display driver IC, the second edge being disposed opposite to the first edge; and
    an image sensor arranged to overlap the sensor area of the display panel,
    wherein first pixels of the plurality of pixels are disposed between the sensor area and the first edge, and the first pixels are connected to the first scan driving circuit through first scan lines,
    wherein second pixels of the plurality of pixels are disposed between the sensor area and the second edge and the second pixels are connected to the second scan driving circuit through second scan lines,
    wherein third pixels of the plurality of pixels are disposed between the sensor area and the third edge and the third pixels are connected to a third scan driving circuit through at least one third scan line across a third edge of the display area, and
    wherein both ends of the third edge extend respectively to the first edge and the second edge.

2. The display device of claim 1, wherein the display panel further comprises at least one data line extended from the display driver IC to electrically connect at least part of the first pixels and at least part of the third pixels.

3. The display device of claim 2, wherein the at least one data line is configured to electrically connect the at least part of the first pixels and the at least part of the third pixels in the non-display area beyond the third edge of the display area.

4. The display device of claim 1, wherein the display panel further comprises:
    first data lines disposed between the sensor area and the first edge, and connected to the first pixels of the plurality of pixels,
    second data lines disposed between the sensor area and the third edge, and connected to the third pixels of the plurality of pixels, and
    connection lines connected between the first data lines and the second data lines.

5. The display device of claim 4, wherein the connection lines are disposed in the display area.

6. The display device of claim 4, wherein at least part of the connection lines is formed on a layer different from a layer on which the first data lines and the second data lines are formed.

7. The display device of claim 2, wherein the display driver IC is configured to transmit a first scan signal for driving the first and second scan driving circuits and a second scan signal for driving the third scan driving circuit.

8. The display device of claim 2, wherein the at least one data line is disposed so as to bypass the sensor area.

9. The display device of claim 7, wherein the display driver IC is further configured to:
    transmit the first scan signal based on data signal transmission to the at least part of the first and second pixels, and
    transmit the second scan signal based on data signal transmission to the at least part of the third pixels.

10. The display device of claim 8, further comprising an opaque member arranged to as to shield the at least one data line bypassing the sensor area.

11. The display device of claim 1, wherein the display driver IC is disposed in the non-display area beyond the fourth edge of the display area.

12. The display device of claim 1, wherein the display panel further comprises:
    a first power driving circuit disposed in the non-display area beyond the first edge of the display area;
    a second power driving circuit disposed in the non-display area beyond the second edge of the display area; and
    a third power driving circuit disposed in the non-display area beyond the third edge of the display area,
    wherein the first pixels of the plurality of pixels are connected to the first power driving circuit through first power lines across the first edge of the display area,
    wherein the second pixels of the plurality of pixels are connected to the second power driving circuit through second power lines across the second edge of the display area, and
    wherein the third pixels of the plurality of pixels are connected to the third power driving circuit through third power lines across the third edge of the display area.

13. The display device of claim 1, wherein the third scan driving circuit is disposed in the non-display area beyond the third edge of the display area, and electrically connected to the display driver IC.

14. The display device of claim 1, wherein the third scan driving circuit is included in at least one of the first scan driving circuit and the second scan driving circuit.

15. A display device, comprising:
    a display driver integrated circuit (IC);
    a display panel comprising:
        a display area, defined by a first edge, second edge, third edge, and fourth edge, and comprising a plurality of pixels,
        a non-display area formed beyond the first to fourth edges of the display area, and
        a sensor area surrounded by pixels of the display area, wherein the sensor area comprises no pixels therein; and
    an image sensor arranged to overlap the sensor area of the display panel,
    wherein first pixels of the display area are disposed between the sensor area and respectively the first, second, and fourth edge, the first pixels of the display area being connected to the display driver IC through first data lines across the fourth edge, and
    wherein second pixels of the display area are disposed between the sensor area and the third edge, the second pixels of the display area being connected to the display driver IC through second data lines across the third edge.

16. The display device of claim 15, wherein the second data lines are connected to at least part of the first data lines in the non-display area beyond the third edge of the display area.

17. The display device of claim 15, wherein the display panel further comprises:
a power driving circuit electrically connected to the display driver IC and disposed in the non-display area, and
at least one power line connected to the plurality of pixels.

18. The display device of claim 15, wherein the display driver IC is disposed in the non-display area beyond the fourth edge of the display area.

19. The display device of claim 15, wherein the first data lines extend to the second data lines.

20. The display device of claim 15, wherein the second data lines are directly connected to the display driver IC.

\* \* \* \* \*